United States Patent
Sander et al.

(12)

(10) Patent No.: US 6,323,531 B1
(45) Date of Patent: Nov. 27, 2001

(54) TWO-CHIP POWER IC HAVING AN IMPROVED SHORT-CIRCUIT RESPONSE

(75) Inventors: Rainald Sander, München; Xaver Schlögel, Sachsenkam; Jenoe Tihanyi, Kirchheim, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/477,132

(22) Filed: Jan. 3, 2000

Related U.S. Application Data

(63) Continuation of application No. PCT/DE98/01638, filed on Jun. 17, 1998.

(30) Foreign Application Priority Data

Jul. 2, 1997 (DE) .............................................. 197 28 281

(51) Int. Cl.[7] ...................... H01L 31/058; H01L 27/142
(52) U.S. Cl. ........................ 257/467; 257/252; 257/499
(58) Field of Search .................................. 257/108, 252, 257/467, 500, 713, 780

(56) References Cited

U.S. PATENT DOCUMENTS 4,808,009 * 2/1989 Sittler et al. ...................... 338/22 SD
4,818,895    4/1989 Kaufman ................................. 174/32
4,947,234    8/1990 Einzinger et al. ..................... 257/500
5,963,782 * 10/1999 Webb ..................................... 438/15

FOREIGN PATENT DOCUMENTS 0 262 530 A1    4/1988 (EP) .
0 379 616   *    8/1990 (EP) .

OTHER PUBLICATIONS

Japanese Patent Abstract No. 06338521 (Fumiaki), dated Dec. 6, 1994.

* cited by examiner

*Primary Examiner*—Eddie Lee
*Assistant Examiner*—Allan R. Wilson
(74) *Attorney, Agent, or Firm*—Herbert L. Lerner; Laurence A. Greenberg; Werner H. Stemer

(57) ABSTRACT

The invention relates to a two-chip power IC, in which a sensor chip having a sensor is mounted on a switch chip having a switch. The sensor is electrically connected to the switch in order to turn the switch off when a temperature detected by the sensor exceeds a threshold value which can be preset. In order to ensure that the sensor chip is heated more quickly, at least one supply line for the switch is routed in the vicinity of the sensor so as to assure good heat transfer from the supply line to the sensor.

6 Claims, 1 Drawing Sheet

TWO-CHIP POWER IC HAVING AN IMPROVED SHORT-CIRCUIT RESPONSE

CROSS-REFERENCE TO RELATED APPLICATIONS

This is a continuation of copending International Application PCT/DE98/01638, filed Jun. 17, 1998, which designated the United States.

BACKGROUND OF THE INVENTION

Field of the Invention

The invention relates to a two-chip power IC, in which a sensor chip having a sensor is mounted on a switch chip having a switch. The sensor is electrically connected to the switch in order to switch it off when the temperature detected by the sensor exceeds a preset threshold value.

Examples of such two-chip power ICs includes a Tempfet ("temperature protected FET") and a Profet ("protected FET"). These two-chip power ICs are effectively resistant to short-circuits, in the event of the short-circuit current being reduced as well, only if the temperature detection ("temperature sensing") can be carried out reliably by means of the sensor chip which is bonded to the switch chip. This means that the temperature sensor (also referred to, for short, as the "sensor" in the following text) must reliably be able to detect a temperature rise in order to be able to switch the switch in the switch chip off in good time before it is destroyed by a short-circuit current. However, this presents a problem when the short-circuit current values are reduced and do not result in the sensor on the sensor chip being heated sufficiently.

In general, the maximum permissible gate-source voltage of a switch, which is generally an FET, in the switch chip must not exceed a specific maximum value in order that the switching-off process in the event of a short-circuit can still be carried out in good time before the switch is destroyed. Even in the case of a sensor chip which is bonded on to the switch chip, it has been found that it is impossible to ensure that the switch chip is reliably switched off in good time, since in many cases the sensor chip is heated only relatively slowly. This is due to the fact that the encapsulation compound which encloses the switch chip and the sensor chip causes the sensor chip to be additionally cooled. As a result, the heating of the switch chip produced before a short-circuit occurs is not sufficient to heat the sensor chip so that the sensor can switch off the switch in the switch chip.

European patent application EP 0 262 530 A1 describes a configuration comprising a power semiconductor chip and a control circuit which is integrated in a second semiconductor chip. The semiconductor chip, together with the control circuit, is thereby mounted on one of the surfaces of the power semiconductor chip, with the two semiconductor chips being connected to one another by means of an insulating layer and a solder layer. The semiconductor chip together with the control circuit is electrically connected via electrical lines to the power semiconductor chip.

The configuration is mounted on a lead frame. The source contact of the power semiconductor chip is connected via two bonding wires to in each case one connecting finger of the lead frame and to one contact of the sensor chip.

SUMMARY OF THE INVENTION

It is accordingly an object of the invention to provide a two-chip power IC having an improved short-circuit response, which overcomes the above-mentioned disadvantages of the heretofore-known devices and methods of this general type and which ensures that the switch in the switch chip is reliably switched off by means of the sensor on the sensor chip, before a short circuit occurs.

With the foregoing and other objects in view there is provided, in accordance with the invention, a two-chip power IC, comprising:

a switch chip having a switch;

a sensor chip mounted on the switch chip, the sensor chip having a sensor electrically connected to the switch of the switch chip for switching the switch off when a temperature detected by the sensor exceeds a preset threshold value;

a direct supply line connecting the switch chip to an outer conductor and being routed in a vicinity of the sensor for enabling good heat transfer between the supply line and the sensor.

In accordance with an added feature of the invention, the switch of the switch chip comprises a MOSFET, the supply line is a source supply line for the MOSFET, and the supply line touches a surface of the sensor chip, at least in certain parts.

In accordance with an additional feature of the invention, the supply line is connected to the surface of the sensor chip by stitch-bonding. In a preferred embodiment, the sensor chip is formed with an aluminum surface and the supply line is connected to the aluminum surface of the sensor chip.

In accordance with another feature of the invention, the switch chip, the sensor chip, and the supply line are encased in an encapsulation compound.

In accordance with a concomitant feature of the invention, the supply line is routed in a loop or in a curve.

In other words, the objects of the invention are satisfied with a two-chip power IC of the type mentioned in the introduction, in which the direct supply line is routed in the vicinity of the sensor, from an outer interconnect to the switch chip. Heat is transferred well between the supply line and the sensor. In this case, the term "vicinity" means that the supply line may also touch the sensor chip of the sensor.

The proper heat transfer mechanism can be assured when the supply line of the sensor touches the surface of the sensor chip at least in places. An advantageous development of the invention in this case provides for the supply line to be connected to the surface of the sensor chip by stitch-bonding. In this case, the supply line may be connected to an aluminum surface of the sensor chip, in order to ensure good heat transfer between the sensor and the supply line leading to the switch in the switch chip. Both chips and the supply line may be enclosed by an encapsulation compound. The supply line is preferably the source supply line for the switch in the switch chip. In an advantageous development of the invention, the supply line may be routed in the form of a loop or curve from the switch in the switch chip to the surface of the sensor chip.

In summary, the invention thus comprises the source bonding wire being routed in the vicinity of the sensor chip in a preferred manner. Before a short-circuit occurs, this bonding wire is heated and, as a result of the proximity between the bonding wire and the sensor chip, the sensor is heated not only from "underneath" by the switch chip, but also from "above" by means of the heat emitted from the bonding wire.

This means that the sensor assumes higher temperatures more quickly, and responds more rapidly to any short-circuit that occurs. The sensor of the sensor chip can thus switch the switch in the switch chip off in good time before it is destroyed by the full-magnitude of the short-circuit current that flows.

Finally, the yield of reliable two-chip power ICs is greater, with the permissible short-circuit load also rising, since the rapid heating of the sensor chip ensures that the switch in the switch chip is switched off reliably.

The contact between the supply line, or the bonding wire, and the surface of the sensor chip may, of course, be designed such that the contact point is electrically insulated from the sensor chip circuit. The above-mentioned aluminum surface must therefore be electrically isolated from the sensor chip circuit, and this can be achieved, for example, without any problems by the aluminum surface being deposited on silicon dioxide.

However, it must be stressed that the supply line, or the bonding wire, does not need to touch the surface of the sensor chip. It is even sufficient for the supply line, or the bonding wire, to be routed close to the surface of the sensor chip in order that the latter is heated by the current flowing in the supply line.

In addition to the sensor, the sensor chip may contain other integrated circuits. It is even possible to fit further chips having integrated circuits on the switch chip in addition to the sensor chip, as well. The term "two-chip power IC" should thus be understood to mean that a switch chip is connected to a sensor chip which protects the switch chip and, if required, may also have further circuits.

Other features which are considered as characteristic for the invention are set forth in the appended claims.

Although the invention is illustrated and described herein as embodied in a two-chip power IC having an improved short-circuit response, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing figure.

DESCRIPTION OF THE PREFERRED EMBODIMENT

Figure 1:
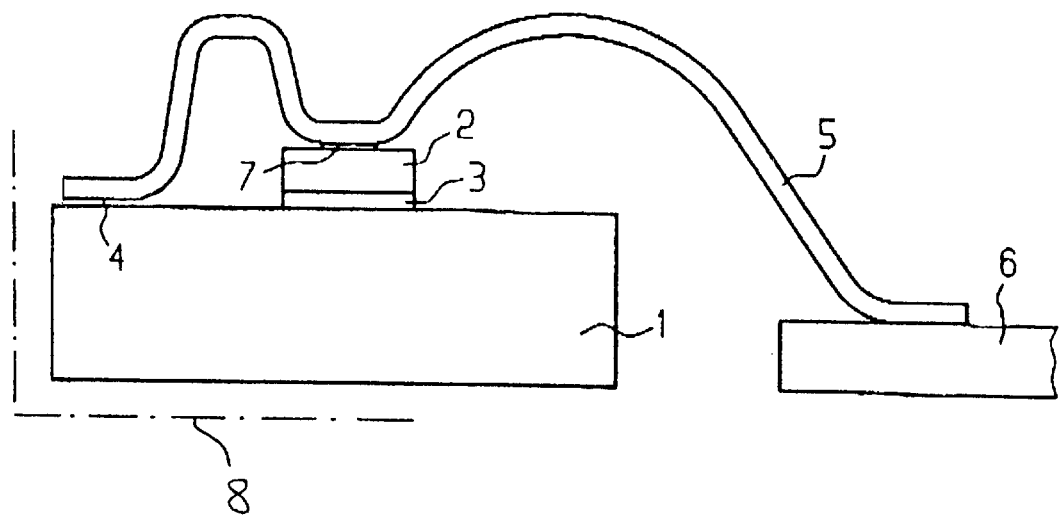
FIG. 1 is a sectional view of a two-chip power IC according to the invention.
Figure 2:
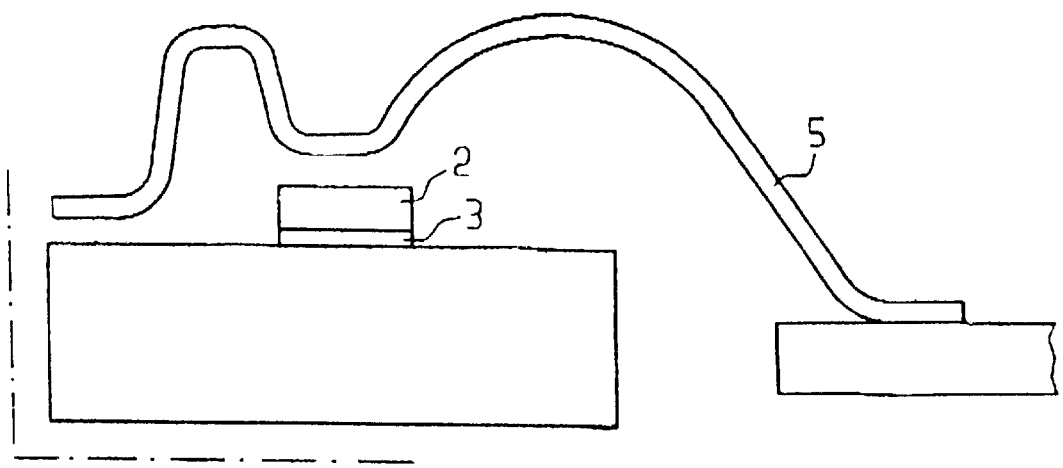
FIG. 2 is sectional view of an alternative embodiment of a two-chip power IC according to the invention.

Referring now to FIGS. 1 and 2 in detail, there is seen a sensor chip 2 arranged on a switch chip 1. The switch chip 1 has a switch comprising, for example, a power MOSFET. The sensor chip 2 is arranged such that it is electrically insulated from the switch chip 1, by means of an adhesive layer 3. An electrical supply line 5, in the form of a bonding wire, leads from a contact 4 on a source electrode of the MOSFET in the switch chip 1 to an outer interconnect 6 in a lead frame. The supply line 5 is designed in the form of a loop or curve and leads to that surface of the sensor chip 2 on which it is connected by stitch-bonding to an aluminum film 7 deposited on the surface of the sensor chip. The aluminum film 7 is electrically insulated from the sensor chip 2.

If a high current flows through the supply line 5, then the heat produced in the supply line 5 heats up the sensor chip 2 in addition to the heat which is emitted from the switch chip 1. In this way, the sensor of the sensor chip 2 responds reliably to the heat produced when a short-circuit occurs, and switches the switch in the switch chip 1 off before this can be destroyed by the short-circuit current.

As has already been mentioned, the supply line 5 does not need to be connected to the surface of the sensor chip 2. In fact, it is sufficient for the supply line 5 to be routed roughly in the relative proximity of the surface of the sensor chip 2.

A diode or a transistor may be used, in the normal way, for the sensor.

The configuration comprising the switch chip 1, the sensor chip 2, and the bonding layer 3 may be encased together with the supply line 5, in the region of the components 1 to 3, by an encapsulation compound. An encapsulation package 8 is diagrammatically illustrated by the dash-dotted lines in the bottom left corner of the drawing figure.

The heating of the sensor chip 2 can be further increased when the supply line 5 is designed in the form of a curve or in the form of a loop in the region of the sensor chip 2. This structure produces a relatively large amount of heating in the vicinity of the sensor chip 2 when a high current occurs in the supply line 5.

In addition to the actual sensor, the sensor chip 2 also contains a circuit by means of which a limit value can be set, such that the switch in the switch chip 1 is switched off if this limit value is exceeded. To this end, the sensor of the sensor chip 2 is electrically connected in a suitable manner to the switch in the switch chip 1. This can be achieved by appropriate interconnects between the sensor chip 2 and the switch chip 1, through the adhesive layer 3.

The exemplary embodiment described above has a supply line 5 which is routed in the vicinity of the sensor chip 2. If required, instead of one supply line, two supply lines for the switch chip 1, for example the source supply line and the drain supply line, may also be arranged in the vicinity of the surface of the sensor chip 2.

We claim:

1. A two-chip power IC, comprising:

a switch chip having a switch;

a sensor chip mounted on said switch chip, said sensor chip having a metal surface and a sensor electrically connected to said switch for switching said switch off when a temperature detected by said sensor exceeds a preset threshold value;

a silicon dioxide layer electrically isolating said metal surface from said sensor; and a direct supply line connecting said switch chip to an outer conductor and being routed in a vicinity of the sensor for enabling heat transfer between said supply line and said sensor, said supply line being one of connected to said metal surface of said sensor chip and contactlessly adjacent said metal surface for heating said sensor by current flowing in said supply line.

2. The two-chip power IC according to claim 1, wherein said switch of said switch chip comprises a MOSFET, said supply line is a source supply line for said MOSFET, and said supply line touches a surface of said sensor chip.

3. The two-chip power IC according to claim 2, wherein said supply line is connected to the surface of said sensor chip by stitch-bonding.

4. The two-chip power IC according to claim 1, which further comprises an encapsulation compound encasing said switch chip, said sensor chip, and said supply line.

5. The two-chip power IC according to claim 1, wherein said supply line is routed in a loop.

6. The two-chip power IC according to claim 1, wherein said supply line is routed in a curve.

* * * * *